United States Patent [19]

Wakabayashi et al.

[11] Patent Number: 4,535,384
[45] Date of Patent: Aug. 13, 1985

[54] HEAT SINK FOR A SEMICONDUCTOR DEVICE

[75] Inventors: Tetsushi Wakabayashi, Kawasaki; Norio Honda, Aizuwakamatsu; Osamu Sakuma, Yokohama, all of Japan

[73] Assignee: Fujitsu Ltd., Kawasaki, Japan

[21] Appl. No.: 620,522

[22] Filed: Jun. 12, 1984

Related U.S. Application Data

[63] Continuation of Ser. No. 538,846, Oct. 5, 1983, abandoned.

[30] Foreign Application Priority Data

Feb. 29, 1980 [JP] Japan ................................. 55-24689

[51] Int. Cl.$^3$ ............................................. H05K 7/20
[52] U.S. Cl. ................................. 361/386; 165/80 B; 174/16 HS
[58] Field of Search ............... 357/81, 82; 174/16 HS; 165/80 B, 80 D, 185; 361/381–384, 386–388, 400

[56] References Cited

U.S. PATENT DOCUMENTS 3,435,891 4/1969 Parrish .......................... 174/16 HS
4,246,597 1/1981 Cole ..................................... 357/81
4,292,647 9/1981 Lee ....................................... 357/81

OTHER PUBLICATIONS

IBM Tech. Disl. Bulletin, vol. 21, No. 9, Feb. 1979, Ng, p. 3591, Circuit Module Package.
IBM Tech. Discl. Bulletin, vol. 11, No. 10, Mar. 1969, Bryden, p. 1323, Heat Sink.

*Primary Examiner*—G. P. Tolin
*Attorney, Agent, or Firm*—Staas & Halsey

[57] ABSTRACT

A semiconductor device comprising at least one heat sink joined to a plurality of IC packages mounted on a mother board. Plural individual heat sinks are joined to respectively corresponding IC packages each comprising a central shaft joined to and extending in substantially perpendicular relationship from a respective said package and plural, parallel spaced fins extending outwardly from and in perpendicular relationship to the shaft. A common heat sink for plural IC packages comprises a base board portion, a heat conducting shaft portion arranged perpendicular to the base board portion and a plurality of heat dissipating fins arranged perpendicular to said heat conducting shaft portion and in parallel, spaced relationship to each other, the common heat sink having one or more slits which are formed parallel to and extending the heat conducting shaft from the base board portion to midway of the height of the heat conducting shaft and defining a plurality of sections of the base board portion, respectively, joined to the plurality of IC packages.

13 Claims, 7 Drawing Figures

Fig. 5
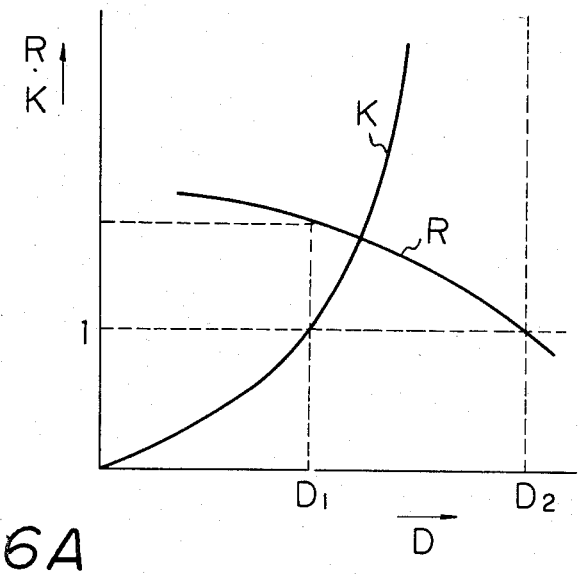
Fig. 6A
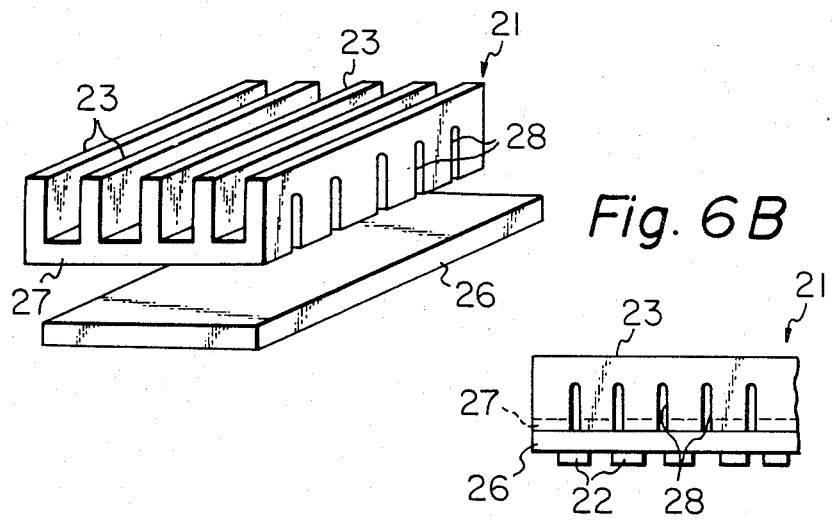
Fig. 6B

HEAT SINK FOR A SEMICONDUCTOR DEVICE

This application is a continuation of application Ser. No. 538,846, filed 10/5/83, now abandoned.

BACKGROUND OF THE INVENTION (1) Field of the Invention

The present invention relates to a semiconductor device, and more particularly to a semiconductor device which has a plurality of IC (Integrated Circuit) packages mounted on a mother board and which has an improved, novel heat sink structure joined to the plurality of IC packages.

(2) Description of the Prior Art

There is known a semiconductor device having a multi-package structure in which a plurality of IC packages are mounted on a single mother board. The multi-package structure has an advantage, for example, that it enables a high integration degree of the semiconductor device.

SUMMARY OF THE INVENTION

It is therefore the principal object of the present invention to provide a semiconductor device comprising an improved, novel heat sink structure which has a high cooling effect.

It is another object of the present invention to provide a semiconductor device comprising an improved, novel heat sink structure which has high mechanical strength and high reliability.

According to the present invention, there are provided various embodiments of semiconductor devices, each of which has a plurality of IC packages adjacently mounted on a mother board. In one embodiment, the plural IC packages each includes a heat conducting shaft portion extending generally perpendicularly from the central, planar surface of each package; each shaft carries plural, generally circular heat dissipating fins. In another embodiment, the semiconductor device has a common heat sink comprising a base board portion, a heat conducting shaft portion arranged approximately perpendicular to the base board portion and a plurality of heat dissipating fins arranged approximately perpendicular to the heat conducting shaft portion and approximately parallel to each other, the common heat sink being joined to the plurality of IC packages at the base board portion.

BRIEF DESCRIPTION OF THE DRAWINGS

FIG. 5 is a graph illustrating characteristics of a heat sink structure used in the semiconductor device according to FIG. 2 of the present invention in comparison with that of the heat sink structure used in the semiconductor device according to FIG. 1 of the present invention;

FIG. 6A is a perspective view illustrating another embodiment of the present invention, and;

FIG. 6B is a side elevational view of the embodiment illustrated in FIG. 6A.

DESCRIPTION OF THE PREFERRED EMBODIMENTS

Figure 1:
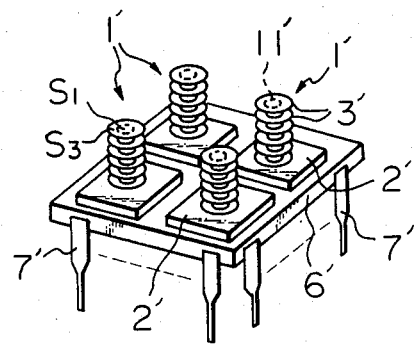
FIG. 1 is a perspective view illustrating a semiconductor device having a multi-package structure in accordance with a first embodiment of the invention.

FIG. 1 illustrates a semiconductor device having a multipackage structure, in accordance with a first embodiment of the invention. The semiconductor device of FIG. 1 comprises a plurality, i.e., four, of IC packages 2' adjacently mounted on a single mother board 6'. A plurality of pin terminals 7' are attached to the edges of the mother board 6' and are connected to the IC packages 2' through a multilayer interconnection buried within the mother board 6'. On each of IC packages 2', a heat sink 1' comprising a heat conducting shaft portion 11' and heat dissipating fins 3' is, respectively, arranged. Each of the heat dissipating fins 3' has, for example, a round shape and is smaller in size (i.e., diameter) than the corresponding lateral outward dimensions of each of the IC packages 2'.

The structure of FIG. 1 affords an effective heat sink arrangement, although it has certain inherent limitations. Particularly, as the density of the package is increased, since a number of individual heat sinks 1' must be mounted within an increasingly smaller area, the space between each of the heat sinks 1' correspondingly decreases. Therefore, cooling air cannot flow smoothly between the heat sinks 1' and the cooling effect of the heat sinks 1' is decreased. Moreover, since the cooling air is supplied from a predetermined direction to the heat sinks 1', the cooling effect of the heat sinks 1' disposed on the side from which the air exits becomes worse than that of the heat sinks 1' disposed on the side at which the air enters. In order to increase the cooling effect of the heat sinks 1', it is generally necessary, for example, to increase the area of each of the heat dissipating fins 3'. However, it is difficult to increase the area of each of the heat dissipating fins 3', because the size of each of the heat dissipating fins 3' must be smaller than the corresponding outward lateral dimensions of each of the IC packages 2'. If the size of each of the heat dissipating fins 3' is approximately equal to or larger than the dimensions of the IC packages 2', and if the latter are adjacently disposed on the mother board 6', it is difficult to mount the IC packages 2', to which the heat dissipating fins 3 are attached, on the mother board 6' in the manufacturing process of the semiconductor device. Moreover, the size of each of the IC packages 2' has been decreased to accommodate the recent requirements of increased packing density of semiconductor devices, with the result that the junction area between the heat sinks 1' and the corresponding, adjacent IC packages 2' becomes small. Therefore, the mechanical strength of the IC packages 2' and the associated heat sinks 1' is decreased and the semiconductor device must be handled very carefully.

Figure 2:
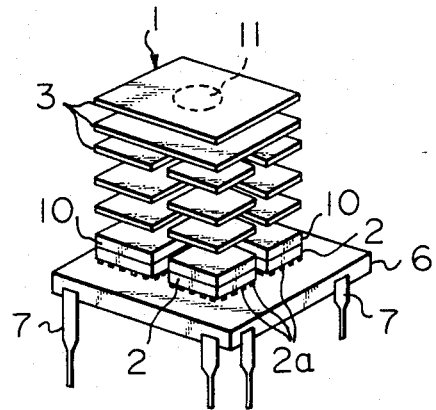
FIG. 2 is a perspective view illustrating a semiconductor device having a multi-package structure and having an improved, novel heat sink structure according to a second embodiment of the present invention.
Figure 3:
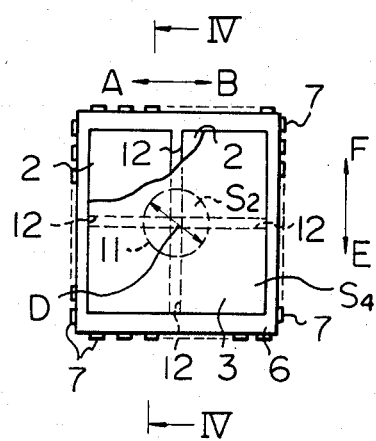
FIG. 3 is a partially cutaway, plan view of the semiconductor device of FIG. 2.
Figure 4:
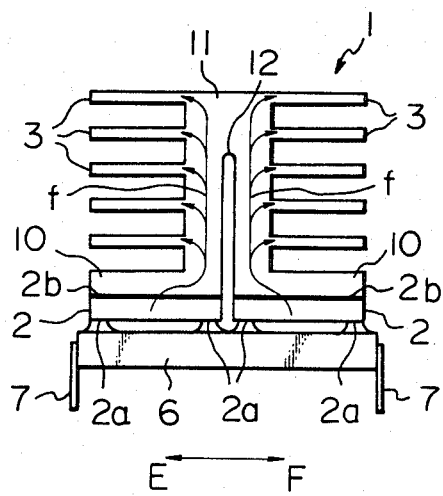
FIG. 4 is a cross sectional view taken on line IV—IV of FIG. 3.

As illustrated in FIG. 2, the semiconductor device according to another embodiment of the present invention comprises a square-shaped mother board 6 within which printed circuit patterns having a multi-layer structure are formed. A plurality of pin terminals 7 are attached to the four edges of the mother board 6 and each of the pin terminals 7 is appropriately electrically connected to the printed circuit within the mother board 6. On the mother board 6, four IC packages 2 are mounted. Each of the IC packages 2 contains a semiconductor element therein and has a plurality of bonding pads 2a at the base thereof which are electrically connected to the semiconductor element. Each of the bonding pads 2a is bonded to a corresponding one of printed circuit patterns (not shown) which are formed on the mother board 6 under the bonding pads 2a and which are connected to the printed circuit patterns formed within the mother board 6. These elements of the structure of FIG. 2 may correspond identically to the similarly numbered, but primed, elements of FIG. 1. The semiconductor device according to this embodiment of the present invention further comprises a common heat sink 1 whose base board portion 10 is adhered to the four IC packages 2 by using, for example, epoxy adhesive agent or by means of brazing. As also illustrated in FIGS. 3 and 4, the heat sink 1 which is made of materials having high terminal conductivity such as aluminum comprises a cylindrical heat conducting shaft portion 11 which has a diameter D and which is arranged perpendicular to the base board portion 10 at the center thereof. A plurality of heat dissipating fins 3 are arranged around the heat conducting shaft portion 11 at a constant distance and in parallel with each other. Each of the heat dissipating fins 3 is a thin board having approximately a square shape. It should be noted that the thickness of the base board portion 10, which has approximately the same shape as that of each of the heat dissipating fins 3, is larger than the thickness of each of the heat dissipating fins 3, in order to lower the thermal resistance from the IC packages 2 to the heat conducting shaft 11. The heat sink 1 has two slits 12, 12 which are formed parallel to the heat conducting shaft 11 and extend from the base board portion 10 to midway of the height of the heat conducting shaft 11 and which divide the base board portion 10, a part of the heat dissipating fins 3 and a part of the heat conducting shaft 11 into four sections.

When the above-mentioned semiconductor device is operated, each of the IC packages 2 generates heat due to the heat generation from the semiconductor element mounted within the IC package. The heat generated from each of the IC packages 2 is transferred, as shown by lines with arrows f in FIG. 4, from the top surfaces 2b of the IC packages 2 through the base board portion 10 of the heat sink 1 to the heat conducting shaft 11. Since the heat conducting shaft 11 is made of materials having high thermal conductivity, the heat conducting shaft 11 is heated up so that the temperature distribution is approximately the same throughout the whole length of the heat conducting shaft 11. The heat delivered to the heat conducting shaft 11 is further transferred from the heat conducting shaft 11 to each of the heat dissipating fins 3 and dissipated into the surrounding air.

The quantity of heat dissipated from the heat sink 1 is greatly influenced by a diameter D of the heat conducting shaft 11, which is a parameter of the heat conducting area of the heat conducting shaft 11, and by the heat dissipating area of each of the heat dissipating fins 3 which is a parameter of a total heat dissipating area of the heat sink 1. Generally, the quantity of the heat dissipated from the heat sink 1 becomes large in accordance with the increase in the above-mentioned diameter D and in the above-mentioned heat dissipating area. However, the outward size of the heat sink 1 is limited to a constant size by the size of the mother board 6 and each of the IC packages 2 and by the surroundings of the semiconductor device and so on. Assume that the sizes of the mother boards and the sizes of the IC packages of both semiconductor devices according to the present invention and shown in FIGS. 1 and 2 are the same as each other. In this condition, since the semiconductor device in FIG. 1 comprises four heat conducting shafts 11', the ratio K of the cross sectional area of the semiconductor device according to FIG. 2 of the present invention to the cross sectional areas of the semiconductor devices of FIG. 1 becomes as follows.

$$K = \frac{S_2}{4S_1} = \frac{\pi}{4S_1}\left(\frac{D}{2}\right)^2 \tag{1}$$

Where $S_1$ designates the heat conducting area, i.e., the cross sectional area of each of the heat conducting shafts 11' of the heat sinks 1 of the semiconductor device in FIG. 1, and $S_2$ designates the cross sectional area of the heat conducting shaft 11 of the semiconductor device according to FIG. 2 of the present invention. The characteristic of the ratio K with regard to the diameter D is shown in FIG. 5

When the same number of heat dissipating fins 3 are arranged parallel to each other, being provided with the heat conducting shafts 11 and 11' of FIGS. 2 and 1, respectively, the ratio R of the heat dissipating area of the heat sink 1 of the semiconductor device according to FIG. 2 of the present invention to the heat dissipating area of the heat sinks 1 of the semiconductor device of FIG. 1 becomes as follows:

$$R = \frac{S_4}{4S_3} = \frac{S_0 - S_2}{4S_3} = \frac{S_0 - \pi(D/2)^2}{4S_3} \tag{2}$$

Where $S_3$ is the area of one side of each of the heat dissipating fins 3' of the semiconductor device 1' of FIG. 1, $S_4$ is the area of one side of each of the heat dissipating fins 3 of the semiconductor device according to FIG. 2 of the present invention, and $S_0$ is the area of one side of each of the heat dissipating fins 3 including the cross sectional area of heat conducting shaft 11 of the semiconductor device according to FIG. 2 of the present invention. The characteristic of the ratio R with regard to the diameter D is also shown in FIG. 5.

As apparent from FIG. 5, when the cross sectional area $4S_1$ of the heat conducting shafts 11' of the semiconductor device of FIG. 1 is equal to the cross sectional area $S_2$ of the heat conducting shaft 11 of the semiconductor device according to FIG. 2 of the present invention, i.e., when the ratio K is equal to 1, the diameter D is equal to $D_1$ and the ratio R is larger than 1. Therefore, the area $S_4$ of each of the heat dissipating fins 3 of the semiconductor device according to FIG. 2 of the present invention can be much larger than the area $4S_3$ of the heat dissipating fins 3' of the semiconductor device of FIG. 1. When the ratio R is equal to 1, the diameter D of the heat conducting shaft of the semiconductor device according to FIG. 2 of the present invention is equal to $D_2$ and the K of the ratio cross sectional areas of the heat conducting shafts 11 and 11' is larger than 1. Therefore, in this case the cross sectional area $S_2$ of the heat conducting shaft of the semiconductor device according to FIG. 2 of the present invention can be larger than the cross sectional area $4S_1$ of the heat conducting shafts of the semiconductor devices of FIG. 1. Therefore, there exists an optimum point of the diameter D of the heat conducting shaft 11 between the diameters $D_1$ and $D_2$ at which point the quantity of heat dissipated into the surrounding air is maximized. The optimum point can be selected, for example, through experiments by using several different heat sinks having different areas $S_2$ and/or $S_4$. Consequently, it is possible to make up a semiconductor device whose cross sectional area $S_2$ of the heat conducting shaft and whose area $S_4$ of each of the heat dissipating fins are both larger than those of the semiconductor device of FIG. 1, so that the quantity of heat dissipated into the surrounding air from the semiconductor device according to FIG. 2 of the present invention is larger than that from the semiconductor device of FIG. 1 of the invention.

When the semiconductor device 1 is operated, the mother board 6 suffers thermal expansion in the directions shown by arrows A, B and E, F in FIG. 3 as it heats up. In response to the thermal expansion of the mother board 6, each of the IC packages 2 which are coupled on the mother board 6 at the bonding pads 2a thereof deviates in the directions shown by the arrows A, B and E, F. Moreover, each of the IC packages 2 is fixed to the base board portion 10 of the heat sink 1 by using for example, epoxy adhesive agent, so that the heat sink 1 suffers forces which deviate every portion of the heat sink 1 in the directions shown by the arrows A, B and E, F. Since the heat sink 1 of the semiconductor device according to FIG. 2 of the present invention has the slits 12, 12 which divide the base board portion 10 of the heat sink 1 into sections each corresponding to one of the IC packages 2, the base board portion 10 of the heat sink 1 can easily move in the directions shown by the arrows A, B and E, F for distances corresponding to the deviation of each of IC packages 2, and the width of each of the slits 12, 12 increases or decreases in accordance with the deviation of each of the IC packages 2. Therefore, the thermal stress between each of the IC packages 2 and the base board portion 10 and between the mother board 6 and each of the IC packages 2 can be greatly reduced, so that separations between the base board portion 10 and the upper surface of each of the IC packages 2 or between each of the IC packages 2 and the mother board 6 due to the thermal stress does not occur. There is a possibility of thermal stress occurring due to the difference of temperature expansion between the heat sink 1 and the IC packages 2 and between the IC packages 2 and the mother board 6, when the heat sink 1 is fixed on the IC packages 2 (which are mounted on the mother board 6) by means of brazing in the manufacturing process of the semiconductor device. However, this latter-mentioned thermal stress is also greatly reduced due to the existence of the slits 12, 12 of the heat sink 1. Therefore, the deformation or destruction of the mother board 6 or the generation of residual stress at the structural junctions of the heat sink 1 due to thermal stress can be prevented.

In the above-mentioned embodiment of FIG. 2, as in the case of FIG. 1, the semiconductor device comprises the mother board 6 which has many pin terminals 7 attached to the four edges thereof and on which four IC packages 2 are mounted. However, it should be noted that the present invention can be adapted, for example, to a semiconductor device comprising many IC packages 22 mounted on a large mother board 26 which does not have pin terminals (i.e., such as the terminals 7 and 7' in FIGS. 1 and 2), as illustrated in FIG. 6A and FIG. 6B. It is also possible to use a heat conducting portion which is formed as a heat conducting board portion 27 as illustrated in FIG. 6A and on which are arranged many heat dissipating fins 23. In the embodiment illustrated in FIGS. 2 through 4, the heat sink 1 is coupled with the mother board 6 via the IC packages 2, which are positioned therebetween. However, the heat sink 1 can be coupled directly with the mother board 6, as illustrated by the heat sink 21 and mother board 6 in FIG. 6B, so long as the heat sink 21 is coupled to the mother board 26 at a plurality of sections of the heat sink 21, as divided and thus defined by the slits 28. In the embodiment of FIGS. 6A and 6B, the heat conducting area of the heat conducting board portion 27 is equal to the area of the portion thereof which forms the junction between the heat conducting board portion 27 and the mother board 26. The heat conducting area of the heat conducting board portion 27 is, quite apparently larger than that of the semiconductor device of FIG. 1 which comprises an individual heat sink 1 on each of the IC packages 2. The area of the heat dissipating fins 23 in FIGS. 6A and 6B can be much larger than that of the fins 3' of the semiconductor device of FIG. 1. Therefore, the semiconductor device of FIGS. 6A and 6B has a larger heat dissipating effect than that of the conventional semiconductor device.

As mentioned above, since the semiconductor devices according to the embodiments of FIGS. 2 to 4, and of FIGS. 5 and 6 of the present invention employ a single heat sink structure 1 and 21 respectively comprising the heat conducting portion, such as the heat conducting shaft portion 11 (FIGS. 2-4) and the board portion 27 (FIGS. 6A and 6B), and a plurality of heat dissipating fins 3 and 23 for each mother board 6 and 26 on which a plurality of IC packages 2 (and 22) are mounted, the substantial heat dissipating area of the heat sink 1 (and 21) employed in the semiconductor devices of FIGS. 2 to 4 and of FIGS. 6A and 6B according to the present invention can be larger than that of the heat sinks 1' of the semiconductor device of FIG. 1, because in the former embodiments of the present invention, the space between the heat sinks 1' on the mother board 6' of the semiconductor device of FIG. 1 can be used to increase the area of the heat dissipating fins 3 (and 23) relative to that of the fins 3' in FIG. 1. Therefore, the cooling air can flow more smoothly through the heat sinks 1 and 21, the quantity of heat dissipated from the heat sinks 1 and 21 on the respective mother boards 6 and 26 can be greater than that of the semiconductor device of FIG. 1. Therefore, the heat sink structures of the semiconductor devices according to the latter embodiments of the present invention afford high cooling performance even when the IC packages of the semiconductor devices are mounted in high density. Since the heat sinks 1 and 21 are coupled to the mother boards 6 and 26 at a plurality of sections, as divided and defined by the slits 12, the mechanical strength of the semiconductor devices 1 and 21 according to the latter two embodiments of the present invention can be very large and the aforementioned thermal stress and residual stress generated in the manufacturing process are greatly reduced due to the existence of the slits 12, thus affording heat sink structures of the semiconductor devices having high reliability.

We claim:

1. A semiconductor device, comprising:

(a) a mother board;

(b) a plurality of IC packages mounted in a matrix arrangement on said mother board, each with a first main surface thereof adjacent to said mother board and a second main surface thereof remote from said mother board, each of said plurality of IC packages housing a semiconductor element therein and having electrical connecting means projecting from said first main surface, and being coupled to said mother board by using only said electrical connecting means; and (c) heat sink means including a base board portion being joined only to said second main surface of said plurality of IC packages, a heat conducting shaft portion arranged approximately perpendicular to said base board portion and a plurality of heat dissipating fins disposed on and extending outwardly from and approximately perpendicular to said heat conducting shaft portion in spaced, approximately parallel relationship to each other, wherein said heat sink means includes a common heat sink having at least one slit extending parallel to and through said heat conducting shaft from said base board portion to approximately midway of the height of said heat conducting shaft to define a number of sections of said base board portion respectively corresponding to said plurality of IC packages, and wherein said common heat sink is joined to said plurality of IC packages at said sections of said base board portion.

2. A semiconductor device as set forth in claim 1, wherein said heat sink includes at least two said slits, and wherein said base board portion is divided by said at least two slits into the same number of said sections as the number of said plurality of said IC packages mounted on said mother board.

3. A semiconductor device as set forth in claim 1, wherein the thickness of said base board portion is larger than the thickness of each of said plurality of heat dissipating fins.

4. A semiconductor device as set forth in claim 1, 2 or 3, wherein each of said plurality of IC packages includes a plurality of bonding pads thereon, wherein said mother board includes printed circuit patterns thereon disposed to be contacted by said plurality of bonding pads of said plurality of IC packages when mounted thereon, and wherein said plurality of IC packages is mounted on said mother board with said plurality of bonding pads of said plurality of IC packages bonded to said printed circuit patterns on said mother board.

5. A semiconductor device as set forth in claim 1, 2 or 3, wherein said heat sink means is joined to said plurality of IC packages by an epoxy adhesive agent.

6. A semiconductor device as set forth in claim 1, 2 or 3, wherein said heat sink means is joined to said plurality of IC packages by brazing said base board portion to said second main surface of said plurality of IC packages.

7. A semiconductor device, comprising:

(a) a plurality of IC packages, each of said plurality of IC packages having first and second, spaced, main surfaces and housing a semiconductor element therein, and having a plurality of bonding pads on said first main surfaces thereof electrically connected to terminals of said semiconductor element thereof;

(b) a plurality of heat sinks respectively mounted only on said second main surfaces of said plurality of IC packages, each said heat sink including a base board portion, a heat conducting shaft portion arranged approximately perpendicular to said base board portion, and a plurality of heat dissipating fins disposed on and extending outwardly from and approximately perpendicular to said heat conducting shaft portion in spaced, approximately parallel relationship to each other, wherein the outer dimension of each of the plurality of heat dissipating fins is smaller than the outer dimension of the corresponding IC package; and (c) a mother board having first and second main surfaces and including electrical contact means disposed in a matrix arrangement on said first main surface thereof contacting only corresponding said bonding pads of said plurality of IC packages, a plurality of pin terminals extending from said second main surface of said mother board, and electrical interconnecting means for interconnecting said contact means and said pin terminals, and said plurality of IC packages being mounted on said mother board with said contact pads of the respective said IC packages contacting said corresponding electrical contact means of said mother board for electrically interconnecting the respective said semiconductor elements of said IC packages through said associated bonding pads and said electrical interconnecting means to said pin terminals of said mother board.

8. A semiconductor device as recited in claim 7, wherein said semiconductor device includes four IC packages, wherein said mother board has an approximately square-shaped periphery of four sides, and wherein said plurality of pin terminals of said mother board is secured to and extends from said four sides of said mother board.

9. A semiconductor device as recited in claim 7, wherein each said heat sink is joined to said corresponding IC package by an epoxy adhesive agent.

10. A semiconductor device are recited in claim 8, wherein each said heat sink is joined to said corresponding IC package by an epoxy adhesive agent.

11. A semiconductor device as recited in claim 7, wherein each said heat sink is joined to said corresponding IC package by brazing said base board portion to said second main surface thereof.

12. A semiconductor device as recited in claim 8, wherein each said heat sink is joined to said corresponding IC package by brazing said base board portion to said second main surface thereof.

13. A semiconductor device as recited in claim 7, 8, 9, 10, 11 or 12, wherein said heat conducting shaft portion of each said heat sink is of a generally columnar shape and wherein each of said plurality of heat dissipating fins of each of said heat sinks has a generally disk shape.

* * * * *

UNITED STATES PATENT AND TRADEMARK OFFICE
CERTIFICATE OF CORRECTION

PATENT NO. : 4,535,384                    Page 1 of 2
DATED     : Aug. 13, 1985
INVENTOR(S) : WAKABAYASHI et al.

It is certified that error appears in the above-identified patent and that said Letters Patent is hereby corrected as shown below:

FRONT PAGE
[73] "Assignee: Fujitsu Ltd., Kawasaki, Japan" s/b
      --Fujitsu Limited, Kawasaki, Japan--;

[57] Abstract
     Line 16, after "extending" insert --through--.

Col. 3
Line 17, "terminal" s/b--thermal--;
Line 55, "a" s/b --the--;
Line 59, "a" (second occurrence) s/b --the--.

Col. 4
Line 59, after "the" (first Occurrence) insert --ratio--;
         delete "ratio".

Col. 6
Line 22, delete "conven-";
Line 23, delete "tional"; after "device" insert --of Fig. 1--.

UNITED STATES PATENT AND TRADEMARK OFFICE
CERTIFICATE OF CORRECTION

PATENT NO. : 4,535,384
DATED : Aug. 13, 1985
INVENTOR(S) : WAKABAYASHI et al.

It is certified that error appears in the above-identified patent and that said Letters Patent is hereby corrected as shown below:

Col. 8
Line 46, "are" s/b --as--.

Signed and Sealed this

Eleventh Day of March 1986

[SEAL]

Attest:

DONALD J. QUIGG

Attesting Officer

Commissioner of Patents and Trademarks